United States Patent
Puszka et al.

(10) Patent No.: US 10,535,721 B2
(45) Date of Patent: Jan. 14, 2020

(54) DISPLAY SYSTEM COMPRISING AN IMAGE SENSOR

(71) Applicant: ISORG, Grenoble (FR)

(72) Inventors: Agathe Puszka, Grenoble (FR);
Quentin Chable, Grenoble (FR);
Benjamin Bouthinon, Grenoble (FR)

(73) Assignee: ISORG, Grenoble (FR)

( * ) Notice: Subject to any disclaimer, the term of this patent is extended or adjusted under 35 U.S.C. 154(b) by 0 days.

(21) Appl. No.: 16/058,776

(22) Filed: Aug. 8, 2018

(65) Prior Publication Data
US 2019/0051709 A1 Feb. 14, 2019

(30) Foreign Application Priority Data
Aug. 11, 2017 (FR) ..................... 17 57670

(51) Int. Cl.
| H01L 27/32 | (2006.01) |
| H01L 51/52 | (2006.01) |
| G06K 9/00 | (2006.01) |
| G06F 3/042 | (2006.01) |
| H01L 27/146 | (2006.01) |

(52) U.S. Cl.
CPC ........ *H01L 27/3234* (2013.01); *G06K 9/0004* (2013.01); *H01L 27/322* (2013.01); *H01L 27/323* (2013.01); *H01L 51/5281* (2013.01); *G06F 3/0421* (2013.01); *H01L 27/14678* (2013.01)

(58) Field of Classification Search
CPC combination set(s) only.
See application file for complete search history.

(56) References Cited

U.S. PATENT DOCUMENTS

| 9,570,002 B2 | 2/2017 | Sakariya et al. |
| 2003/0179323 A1* | 9/2003 | Abileah .............. G02F 1/13338 349/24 |
| 2011/0042766 A1* | 2/2011 | Kurokawa ........ G02F 1/133514 257/432 |

(Continued)

FOREIGN PATENT DOCUMENTS

WO  2017/095858 A1  6/2017

OTHER PUBLICATIONS

Search Report issued in French patent application No. 17/57670, dated Apr. 6, 2018.

*Primary Examiner* — Mamadou L Diallo
(74) *Attorney, Agent, or Firm* — Kaplan Breyer Schwarz, LLP

(57) ABSTRACT

A display system including a display screen having first and second display sub-pixels where each first display sub-pixel includes a first light-emitting component emitting a first radiation and covered with a first colored filter and first conductive tracks and where each second display sub-pixel includes a second light-emitting component emitting a second radiation and covered with a second colored filter and second conductive tracks. The display system further includes an image sensor detecting the first or second radiation or a third radiation. The first display sub-pixels include first elements absorbing the first radiation and the second radiation and covering the first conductive tracks. The first absorbing elements and/or the first colored filter delimit a first passageway along the stacking direction for the first, second, or third radiation.

9 Claims, 5 Drawing Sheets

(56) References Cited

U.S. PATENT DOCUMENTS

| | | | |
|---|---|---|---|
| 2013/0127790 A1* | 5/2013 | Wassvik | G06F 3/042 345/175 |
| 2015/0055057 A1* | 2/2015 | Huang | G02F 1/13338 349/62 |
| 2015/0331508 A1* | 11/2015 | Nho | G06F 3/0421 345/173 |
| 2015/0333285 A1* | 11/2015 | Ogasawara | H01L 27/322 257/40 |

* cited by examiner

DISPLAY SYSTEM COMPRISING AN IMAGE SENSOR

This application claims the priority benefit of French patent application number FR17/57670, the content of which is hereby incorporated by reference in its entirety to the maximum extent allowable by law.

BACKGROUND

The present disclosure relates to a display and detection system, and more particularly to a display system comprising an image sensor.

DISCUSSION OF THE RELATED ART

For certain applications, it is desirable to be able to detect a fingerprint of a user by means of a fingerprint sensor integrated to a display screen. As an example, a display screen provided with a fingerprint sensor may equip cell phones. There exist display and detection systems comprising a display screen and an optical image sensor which might enable to form a finger-print sensor. U.S. Pat. No. 9,570,002 describes an example of such a display and detection system comprising a display screen and an infrared image sensor.

Most display screens are partially reflective and it is necessary, for the user's comfort, to attenuate possible reflections. Thus, such display screens are generally equipped with an antireflection system. An example of antireflection system is described in relation with FIG. 1.

FIG. 1 is an exploded simplified view of a partially reflective display screen 1 covered with an antireflection system 3.

Antireflection system 3 is positioned in front of display screen 1. Antireflection system 3 comprises a rectilinear polarizer 5 and a quarter-wave plate 7. Quarter-wave plate 7 is positioned between rectilinear polarizer 5 and display screen 1. The axes of quarter-wave plate 7 are oriented at 45 degrees with respect to the axis of rectilinear polarizer 5.

Antireflection system 3 operates as follows. An incident non-polarized light beam $R_i$ crosses, in the first place, rectilinear polarizer 5 and becomes a light beam $R_1$ with a rectilinear polarization. Quarter-wave plate 7 then turns light beam $R_1$ into a light beam $R_2$ with a right-handed or left-handed circular polarization. Beam $R_2$ is partially reflected by display screen 1 into a reflected light beam $R_3$. The reflected light beam $R_3$ has a circular polarization inverse to that of light beam $R_2$, that is, left-handed or right-handed. Quarter-wave plate 7 then turns light beam $R_3$ into a light beam $R_4$ with a rectilinear polarization. The polarization direction of light beam $R_4$ is then orthogonal to that of light beam $R_1$. Polarizer 5 then prevents light beam $R_4$ from passing.

It would be desirable to form a display system equipped with an antireflection system comprising an optical image sensor, particularly for the detection of fingerprints.

SUMMARY

Thus, an embodiment provides a display and detection system comprising a display screen comprising a stack of layers along a stacking direction and comprising first and second display sub-pixels, each first display sub-pixel comprising a first light-emitting component capable of emitting a first radiation and covered with a first colored filter and first electrically-conductive tracks, each second display sub-pixel comprising a second light-emitting component capable of emitting a second radiation and covered with a second colored filter and second electrically-conductive tracks, the first colored filter is capable of letting through the first radiation and of blocking the second radiation, the second colored filter being capable of letting through the second radiation and of blocking the first radiation, the display and detection system further comprising an image sensor covered with the display screen and capable of detecting the first radiation, the second radiation, or a third radiation, the first electrically-conductive tracks being made of a material absorbing the first radiation and the second radiation or being transparent for the first radiation and the second radiation or at least the first display sub-pixels comprising first elements absorbing the first radiation and the second radiation and covering the first electrically-conductive tracks, wherein, for each first display sub-pixel, the first absorbing elements, the first colored filter, and/or the first electrically-conductive tracks delimit at least one first passageway according to the stacking direction for the first radiation, the second radiation, or third radiation.

According to an embodiment, for each first display sub-pixel, the entire surface area of the first sub-pixel is covered with the first absorbing elements and the first colored filter.

According to an embodiment, the display and detection system comprises at least one dielectric layer interposed between the first absorbing elements and the first electrically-conductive tracks.

According to an embodiment, the first absorbing elements are in contact with the first electrically-conductive tracks.

According to an embodiment, the image sensor is capable of detecting the second radiation and the first absorbing elements comprise third colored filters capable of letting through the second radiation and of blocking the first radiation.

According to an embodiment, the image sensor is capable of detecting the third radiation and the first absorbing elements comprise fourth colored filters capable of letting through the third radiation and of blocking the first and second radiations.

According to an embodiment, the first elements absorb the third radiation.

According to an embodiment, the second display sub-pixels comprise second elements absorbing the first radiation and the second radiation and covering the second electrically-conductive tracks.

According to an embodiment, the second absorbing elements and/or the second colored filter delimit at least one second passageway for the second radiation.

According to an embodiment, the second passageway is covered with a fifth colored filter capable of letting through the second radiation.

According to an embodiment, the display and detection system further comprises an angular filter capable of blocking incident rays having an incidence relative to a direction orthogonal to a surface of the angular filter greater than a threshold and of letting through at least certain incident rays having an incidence relative to a direction orthogonal to the surface smaller than the threshold.

According to an embodiment, the first absorbing elements form the angular filter.

The foregoing and other features and advantages will be discussed in detail in the following non-limiting description of specific embodiments in connection with the accompanying drawings.

DETAILED DESCRIPTION

Figure 1:
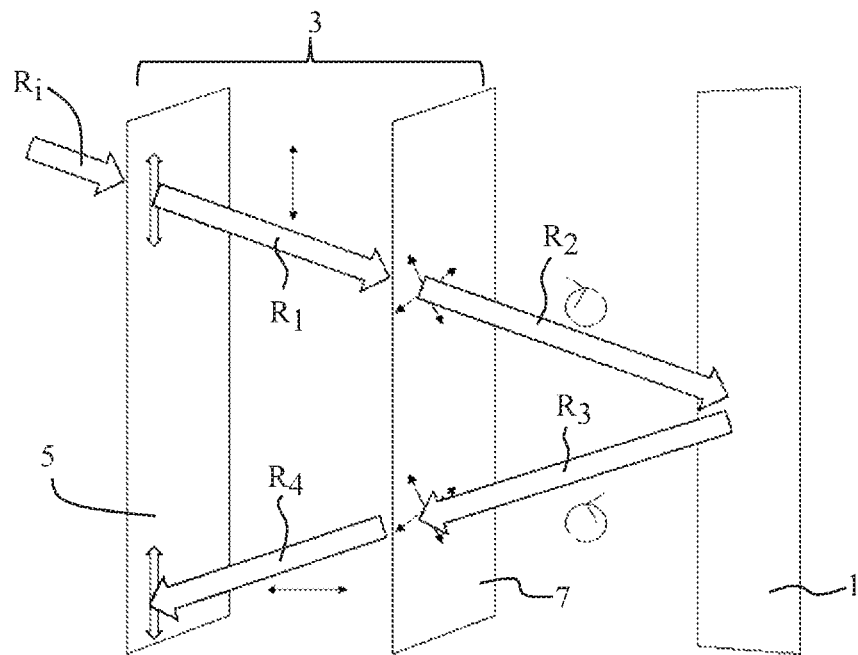
FIG. 1, previously described, illustrates an anti-reflection system.

The same elements have been designated with the same reference numerals in the different drawings. For clarity, only those steps and elements which are useful to the understanding of the described embodiments have been shown and are detailed.

In the following description, when reference is made to terms qualifying the relative position such as "rear", "top", "bottom", etc., reference is made to the orientation of the drawings. The term "approximately" is used herein to designate a tolerance of plus or minus 10%, preferably plus or minus 5%, of the value in question.

In the following description, "visible light" designates an electromagnetic radiation having a wavelength in the range from 400 nm to 700 nm and "infrared radiation" designates an electromagnetic radiation having a wavelength in the range from 700 nm to 10 µm. Further, "element absorbing a radiation" or "element made of a material absorbing a radiation" means an element absorbing at least 90%, preferably at least 95% of said radiation.

A pixel of an image corresponds to the unit element of the image displayed by a display screen. When the display screen is a color image display screen, it generally comprises, for the display of each image pixel, at least three emission and/or light intensity regulation components, also called display sub-pixels, which each emit a light radiation substantially in a single color (for example, red, green, or blue). The superposition of the radiations emitted by the three display sub-pixels provides the observer with the colored sensation corresponding to the pixel of the displayed image. In this case, the assembly formed by the three sub-display pixels used to display a pixel of an image is called display pixel of the display screen.

Figure 2:
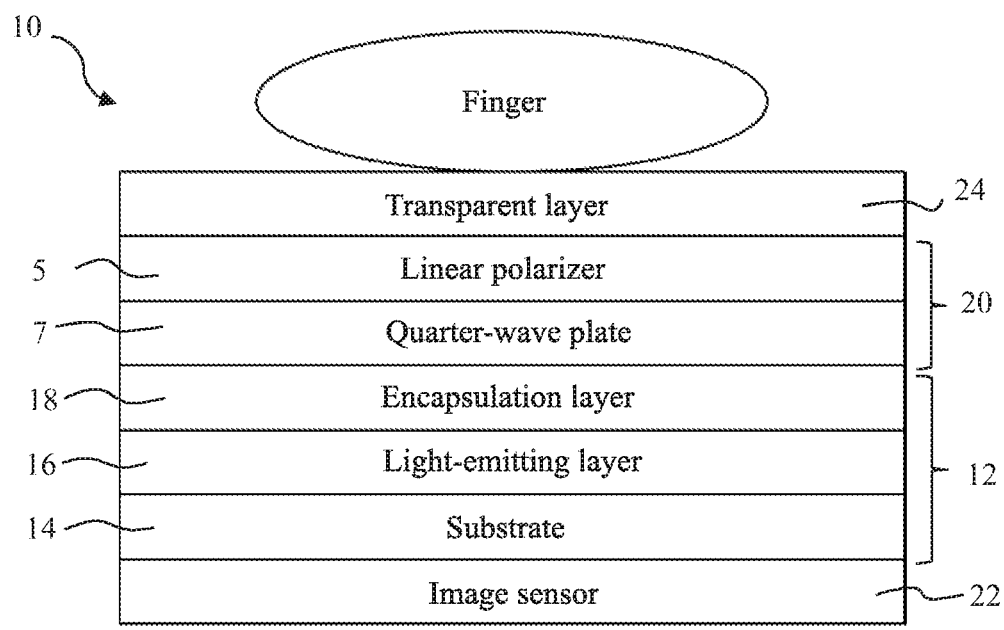
FIG. 2 is a simplified diagram of a display and detection system.

FIG. 2 is a simplified diagram of a display and detection system 10 capable of displaying an image and of detecting an image, for example, a fingerprint.

Display and detection system 10 comprises a display screen 12. Display screen 12 is for example formed of a stack successively comprising:
  a transparent or partially transparent substrate 14, for example, made of a polymer or of glass;
  a light-emitting layer 16 laid on substrate 14 and in contact therewith; and
  a transparent or partially transparent encapsulation layer 18, for example, made of a polymer, an inorganic layer ($SiN_x$, $SiO_x$, $Al_2O_3$) or a multilayer of organic and inorganic layers, laid on light-emitting layer 16 and in contact therewith.

Substrate 14 and encapsulation layer 18 are transparent or partially transparent to visible light and to infrared radiation.

Light-emitting layer 16 comprises an array of display pixels. Each display pixel comprises an optoelectronic component capable of emitting an electromagnetic radiation, also called light-emitting component. Each light-emitting component for example corresponds to a light-emitting diode, particularly, to an organic light-emitting diode (OLED). The display pixels may further comprise electrically-conductive tracks and switching elements, particularly transistors, not shown, enabling to select display pixels.

Display and detection system 10 further comprises an antireflection system 20 of the type described in relation with FIG. 1. It shows rectilinear polarizer 5 and quarter-wave plate 7. Antireflection system 20 is arranged on top of and in contact with display screen 12, that is, quarter-wave plate 7 rests on top of and in contact with encapsulation layer 18 of display screen 12.

Display and detection system 10 further comprises an image sensor 22. As an example, image sensor 22 is located under display screen 12, that is, substrate 14 of display screen 12 rests on top of and in contact with image sensor 22. Image sensor 22 comprises an array of photon sensors, or photodetectors. The photodetectors are arranged so that an incident radiation reaches them after having crossed display screen 12. As an example, the photodetectors are positioned at the level of the interstices between the light-emitting components of light-emitting layer 16 to receive a light radiation passing through the display screen. The photodetectors may be covered with a transparent protective coating, not shown. Image sensor 22 further comprises conductive tracks and switching elements, particularly transistors, not shown, enabling to select the photodetectors. The photodetectors may be made of organic materials. The photodetectors may correspond to organic photodiodes (OPD) or to organic photoresistors. Display and detection system 10 further comprises means, not shown, for processing the signals supplied by image sensor 22, for example comprising a microprocessor, and means, not shown, for controlling display screen 12.

As an example, image sensor 22 may be used to detect the fingerprint of at least one finger of a user. Preferably, image sensor 22 may be used to simultaneously detect the fingerprints of a plurality of fingers of the user. According to an embodiment, image sensor 22 may play the role of a touch surface, where the location of an object or member on the display and detection system 10 is determined by the photodetectors. Display and detection system 10 may then be used as a controllable interactive user interface by simple sliding of the finger or of the hand on the touch surface. Such an interactive user interface may particularly be used to control cells phones, computers, television sets, motor vehicles, automated ticketing machines, industrial equipment, medical equipment, etc.

Display and detection system 10 further comprises a transparent protective coating 24 resting on top of and in contact with antireflection system 20. This coating is transparent to visible light and to infrared radiation. Protective coating 24 is for example a glass plate or a transparent layer made of a polymer.

According to a first embodiment, an object or member, for example, a finger, may be illuminated by a source external to the display and detection system, which emits a radiation which crosses or is reflected by the object or member. The object or member then emits a non-polarized light radiation towards the photodetectors of image sensor 22. Such a non-polarized radiation crosses polarizer 5 and 50% of its intensity is lost.

According to a second operating mode, the object or the member is not illuminated by an external source. It is then illuminated by a non-polarized light radiation emitted by light-emitting layer 16 of display screen 12. The light radiation polarizes and loses part of its intensity through polarizer 5. This light radiation reflects on the object or the member and is reflected. The reflected radiation crosses polarizer 5 and loses again part of its intensity.

Thus, a disadvantage of such a display and detection system 10 is that the polarizer 5 of antireflection system 20 decreases the luminosity of the image of the object or member on image sensor 22.

The inventors have shown that most reflections observed by a user originate from the reflection of an external radiation on the metal elements of display and detection system 10, particularly the metal tracks for controlling the light-emitting components of display screen 12 or the electrode having the active region of the light-emitting components of display screen 12 formed thereon. The inventors have further shown that the layer of the polarizer used as an antireflection layer would make the detection of fingerprints difficult since the signal sent back from the fingers is strongly attenuated. There thus is a need to find an alternative enabling both to guarantee an antireflection function and to let through the signal useful for the image sensor, particularly for fingerprint detection.

Figure 3:
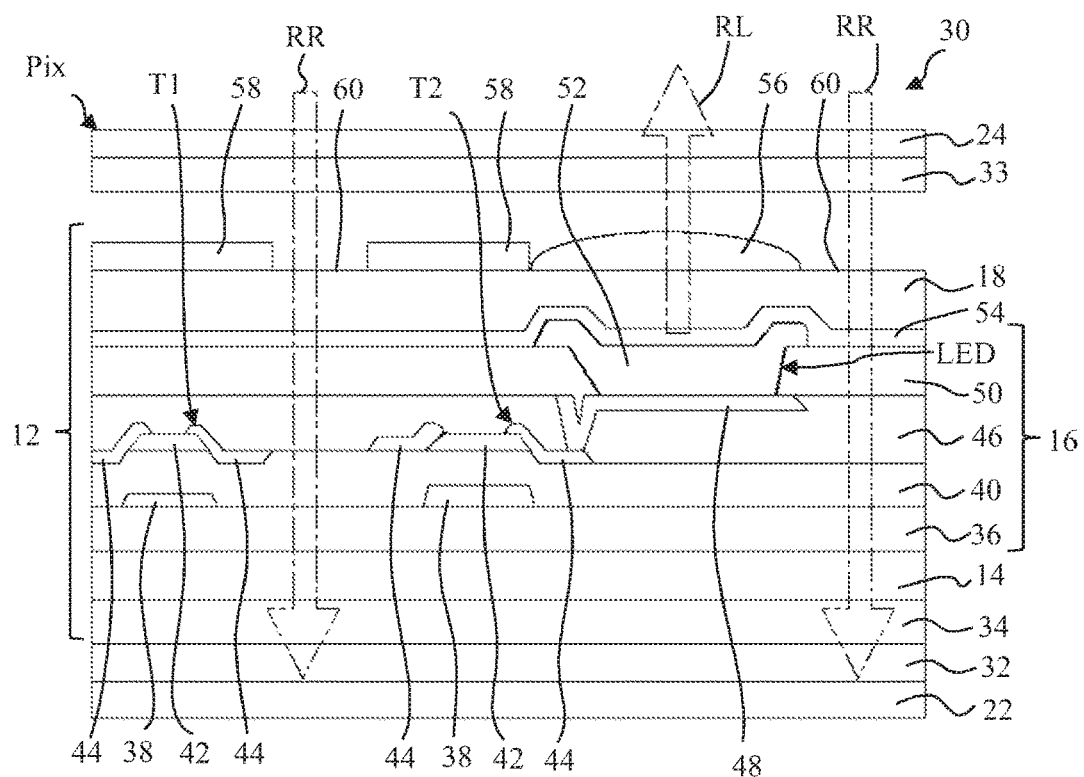
FIGS. 3 to 11 are partial simplified cross-section views of embodiments of a display and detection system comprising a display screen and an image sensor.

FIG. 3 is a partial simplified cross-section view of an embodiment of a display and detection system 30 capable of detecting an image, for example, a fingerprint.

Display and detection system 30 comprises all the elements of display and detection system 10 shown in FIG. 2, with the difference that antireflection system 20 is not present.

FIG. 3 further shows:
- an adhesive layer 32 between image sensor 22 and display screen 12;
- an adhesive layer 33 between transparent layer 24 and display screen 12; and
- a rear encapsulation layer 34 of display screen 12 covering the surface of substrate 14 located on the side of image sensor 22.

A touch surface, also called touch pad, not shown, may be provided between display screen 12 and transparent layer 24.

Rear encapsulation layer 34 may correspond to a polyethylene terephthalate layer (PET) having, for example, a thickness in the order of 100 μm. Substrate 14 may correspond to a polyamide layer for example having a thickness in the order of 10 μm.

In FIG. 3 and in the following drawings, layers 24 and 33 are shown at a distance from display screen 12 while in reality, layer 33 is in contact with display screen 12.

FIG. 3 schematically shows a display sub-pixel Pix comprising a light-emitting diode LED and two field-effect transistors T1 and T2. Transistors T1 and T2 may be organic or inorganic transistors, for example, transistors made up of amorphous silicon aSi, of metal oxide, particularly of indium gallium zinc oxide (IGZO), or of polysilicon, particularly low-temperature polysilicon (LTPS).

Light-emitting layer 16 of display screen 12 comprises, for each display sub-pixel Pix, a stack of layers comprising, from bottom to top in FIG. 3:
- an interface layer 36, also called buffer layer, resting on substrate 14 and in contact with substrate 14;
- electrically-conductive tracks 38, for example, metallic, forming the gates of transistors T1 and T2;
- a dielectric layer 40 covering conductive tracks 38 and the portions of interface layer 36 which are not covered with conductive tracks 38;
- organic or inorganic semiconductor regions 42, particularly made up of amorphous silicon aSi, of metal oxide, particularly IGZO, or of polysilicon, particularly LTPS, resting on dielectric layer 40 where the channel regions of transistors T1 and T2 are formed, the portions of dielectric layer 40 interposed between conductive tracks 38 and semiconductor regions 42 forming the gate insulators of transistors T1 and T2;
- electrically-conductive tracks 44 resting on dielectric layer 40, in contact with region 42 and particularly forming the source and drain contacts of transistors T1 and T2;
- a dielectric layer 46 covering transistors T1 and T2 and dielectric layer 40 next to transistors T1 and T2;
- an electrode 48 of the light-emitting diode, LED, extending over dielectric layer 46 and extending through dielectric layer 46 to come into contact with one of conductive tracks 44, electrode 48 for example playing the role of an anode;
- a dielectric layer 50 which covers dielectric layer 46 and does not or only partially covers electrode 48 and which enables to insulate the light-emitting diodes from one another;
- an active region 52 of the light-emitting diode, LED, capable of emitting a radiation and resting on electrode 48 and in contact with electrode 48 through dielectric layer 50; and
- an electrically-conductive layer 54 partially transparent to the radiation emitted by active region 52, for example, with a 50% transparency, to create an optical cavity partially transparent to the radiation detected by image sensor 22 and covering dielectric layer 50 and active region 52 and in contact with active region 52.

Encapsulation layer 18 rests on conductive and partially transparent layer 54.

In the present embodiment, display screen 12 further comprises a colored filter 56 resting on encapsulation layer 18 opposite active region 52, along the stacking direction of the layers of display screen 12, and absorbing elements 58, also called black matrix, for the radiation detected by image sensor 22 and for the radiation detectable by an observer, resting on encapsulation layer 18 opposite transistors T1 and T2 of conductive tracks 44 along the stacking direction of layers of display screen 12. Areas 60 of encapsulation layer 18 are covered neither by colored filter 56, nor by absorbing elements 58. Areas 60 are laterally delimited by absorbing elements 58 and/or colored filter 56. Areas 60 do not face, along the stacking direction of the layers of display screen 12, conductive tracks 38 and 44. Colored filter 56 may be made of colored resin and absorbing elements 58 may be made of black resin or of dyed resin, for example, of black SU-8 resin. According to an embodiment, the photodetectors of image sensor 22 may be arranged opposite areas 60 along the stacking direction of display screen 12.

In the present embodiment, the transmittance of colored filter 56 is close to the emission spectrum of active region 52 of the light-emitting diode, LED. This means that colored filter 56 substantially totally lets through the light emitted by active region 52 of the light-emitting diode, LED, and blocks the other wavelengths.

The radiation, RL, emitted by active region 52 of the light-emitting diode, LED, crosses the colored filter 56 covering the light-emitting component, LED. The transmittance of colored filter 56 being close to the emission spectrum of the light-emitting diode, LED, the radiation RL emitted by active region 52 is substantially not attenuated by colored filter 56.

In the presence of an object in front of transparent layer 24, radiation RL is at least partly reflected by the object, not shown, for example, a user's finger. The reflected radiation RR is absorbed by absorbing elements 58, except at the level of areas 60 where the reflected radiation RR advances until it reaches image sensor 22. Since there is no antireflection system comprising a polarizer and a quarter-wave plate, the attenuation of the reflected radiation RR, as its advances towards image sensor 22, is decreased.

The external radiation which reaches transparent layer 24 is absorbed by absorbing elements 58 without reflecting on conductive tracks 38, 44 covered with elements 58. Further, the outer radiation which passes through areas 60 is not or little reflected. An antireflection function is thus obtained. The external radiation which reaches colored filter 56 may reflect, in particular, on electrode 48. However, given that this radiation is filtered by colored filter 56, the intensity of the radiation reflected towards an observer is decreased.

Figure 4:
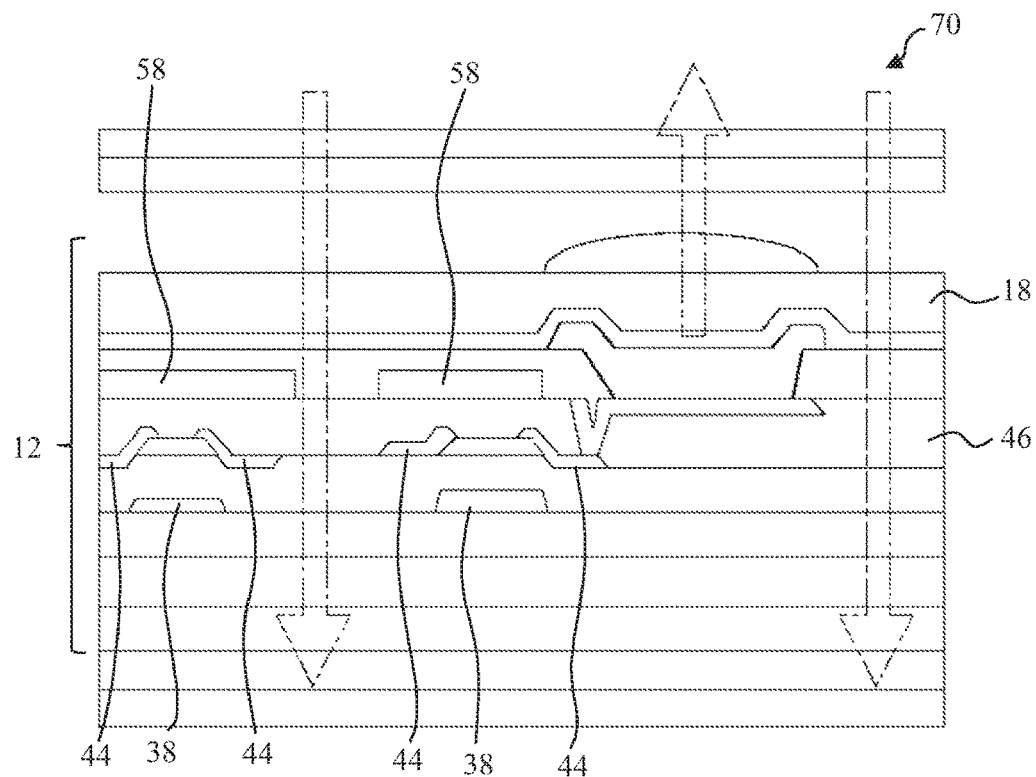

FIG. 4 is a cross-section view similar to FIG. 3 of another embodiment of a display and detection system 70. Display and detection system 70 comprises all the elements of display and detection system 30 shown in FIG. 3, with the difference that absorbing elements 58, instead of resting on encapsulation layer 18, rest on dielectric layer 46 opposite conductive tracks 38, 44 along the stacking direction of display screen 12.

As a variation, absorbing elements 58 may be directly deposited on conductive tracks 38, 44. Generally, absorbing elements 58 may be deposited opposite conductive tracks 38, 44 along the stacking direction of the layers of display screen 12 at any level between transparent layer 24 and conductive tracks 38, 44.

Figure 5:
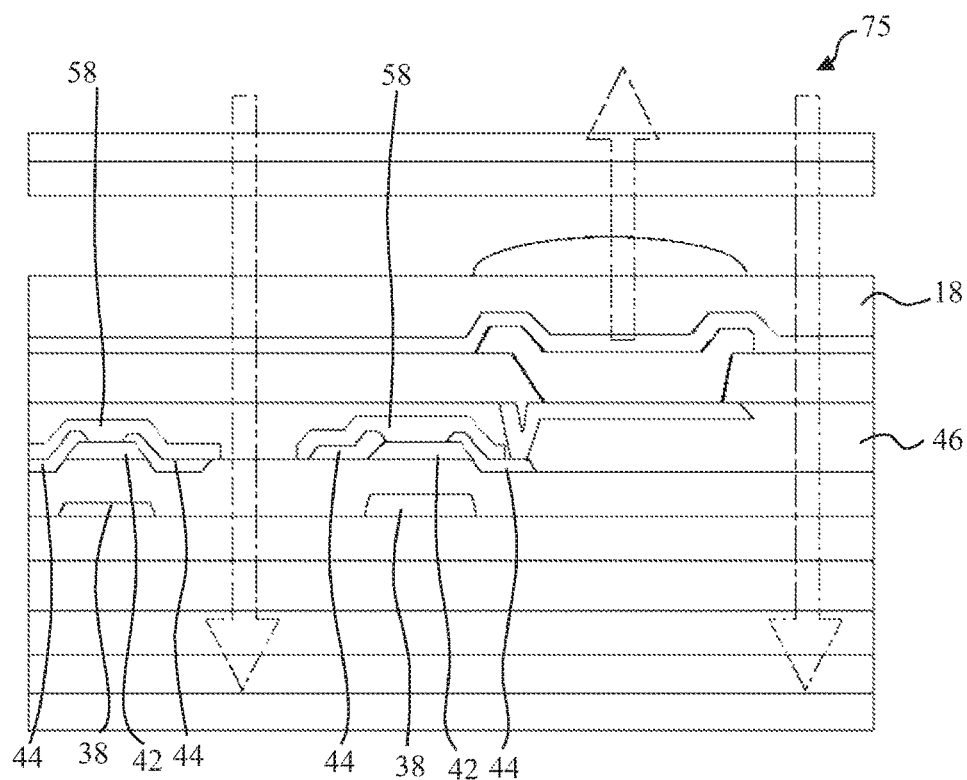

FIG. 5 is a cross-section view similar to FIG. 3 of another embodiment of a display and detection system 75. Display and detection system 75 comprises all the elements of display and detection system 30 shown in FIG. 3, with the difference that absorbing elements 58, instead of resting on encapsulation layer 18, directly rest on conductive tracks 44 and on active regions 42.

Figure 6:
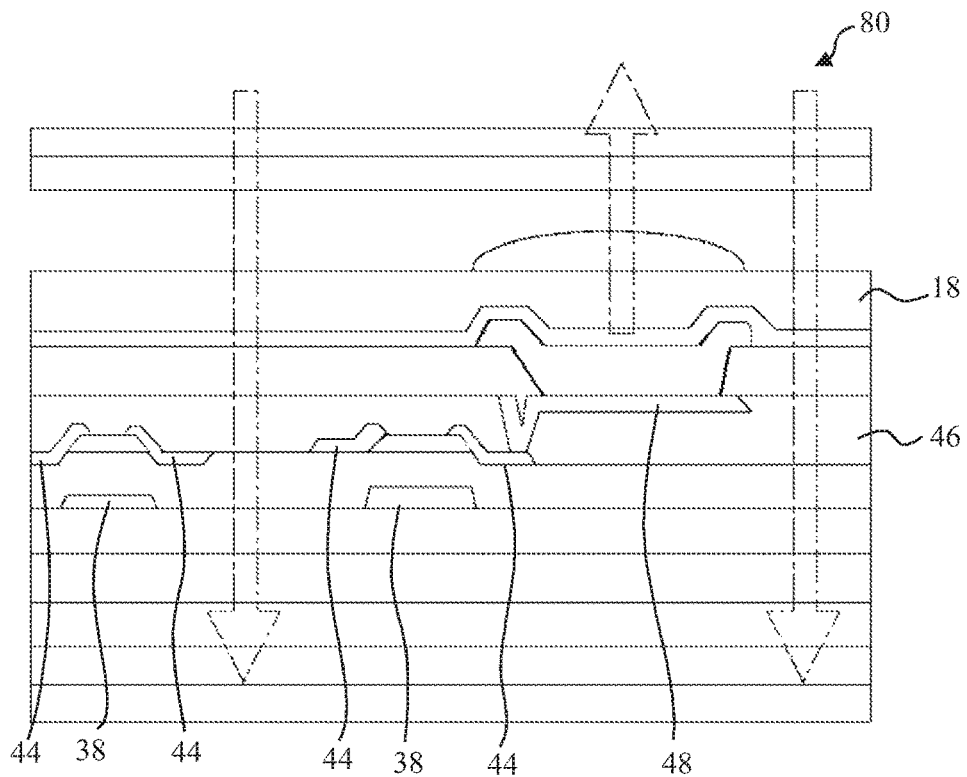

FIG. 6 is a cross-section view similar to FIG. 3 of another embodiment of a display and detection system 80. Display and detection system 80 comprises all the elements of display and detection system 30 shown in FIG. 3, with the difference that absorbing elements 58 are not present and that conductive tracks 38, 44 and possibly electrode 48 are made of an electrically-conductive material absorbing in the visible range, for example, chromium (Cr), nickel (Ni), aluminum (Al), a material transparent in the visible range such as metal oxides, for example, indium-tin oxide (ITO), or a metal transparent in the visible range when it is deposited in a sufficiently thin layer, for example, with a thickness smaller than 100 nm.

Figure 7:
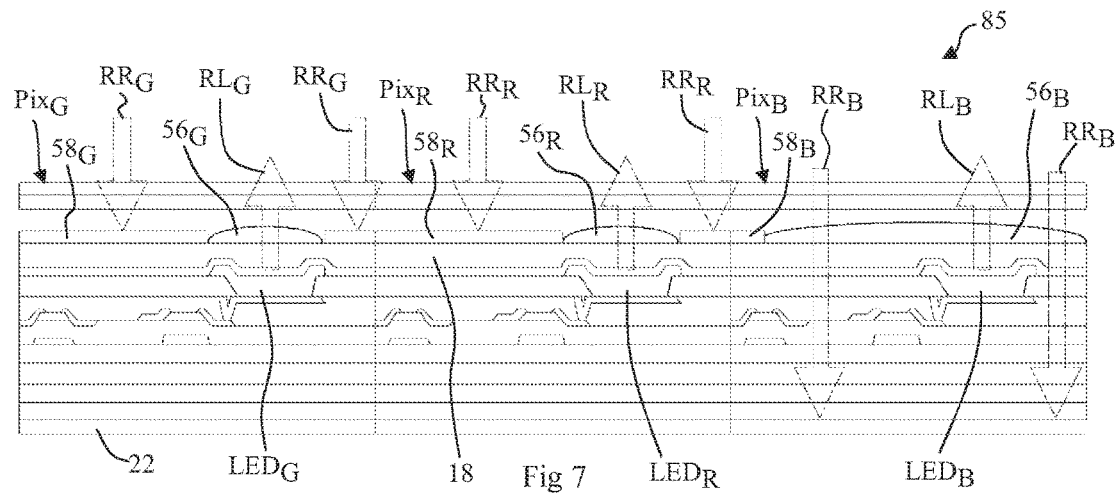

FIG. 7 is a cross-section view of another embodiment of a display and detection system 85. In FIG. 7, three display sub-pixels are shown, for example, one display sub-pixel $Pix_G$ emitting green light, one display sub-pixel $Pix_R$ emitting red light, and one display sub-pixel $Pix_B$ emitting blue light. However, the following description also applies in the case where pixel $Pix_B$ emits light of any color, for example, red light or green light.

In the following description, suffix G, R, or B is added to a reference to indicate that the element designated with the reference respectively belongs to display sub-pixel $Pix_G$, $Pix_R$, or $Pix_B$.

In the present embodiment, each display sub-pixel $Pix_G$ and $Pix_R$ has the structure shown in FIG. 3, with the difference that absorbing elements $58_G$ and $58_R$ totally cover encapsulation layer 18 around colored filter $56_G$ and $56_R$. Display sub-pixel $Pix_B$ has the structure shown in FIG. 3, with the difference that colored filter $56_B$ extends in top view over a larger surface area than that occupied by light-emitting diode $LED_G$, for example, substantially over more than 80% of the surface area of display sub-pixel $Pix_B$, preferably over more 90% of the surface area of display sub-pixel $Pix_B$, opaque elements $58_B$ covering less than 20% of the surface area of display sub-pixel $Pix_B$, preferably less than 10% of the surface area of display sub-pixel $Pix_B$.

For display sub-pixels $Pix_G$ and $Pix_R$, the radiation $RL_G$ and $RL_R$ emitted by light-emitting diode $LED_G$ and $LED_R$ propagates through colored filter $56_G$ and $56_R$. For display sub-pixels $Pix_G$ and $Pix_R$, the reflected radiation $RR_G$ and $RR_B$ is blocked by absorbing elements $58_G$ and $58_R$. For display sub-pixel $Pix_B$, the radiation $RL_B$ emitted by light-emitting diode $LED_B$ propagates through colored filter $56_B$. The reflected radiation $RR_B$ propagates from colored filter $56_B$ to image sensor 22. A wavelength filtering of the radiation which reaches image sensor 22 is thus obtained. The inventors have shown that, for an application for fingerprint detection, a stronger contrast of the image of the fingerprint can be obtained when the wavelength range of the radiation reaching sensor 22 is decreased, particularly when the radiation reaching sensor 22 is blue.

Figure 8:
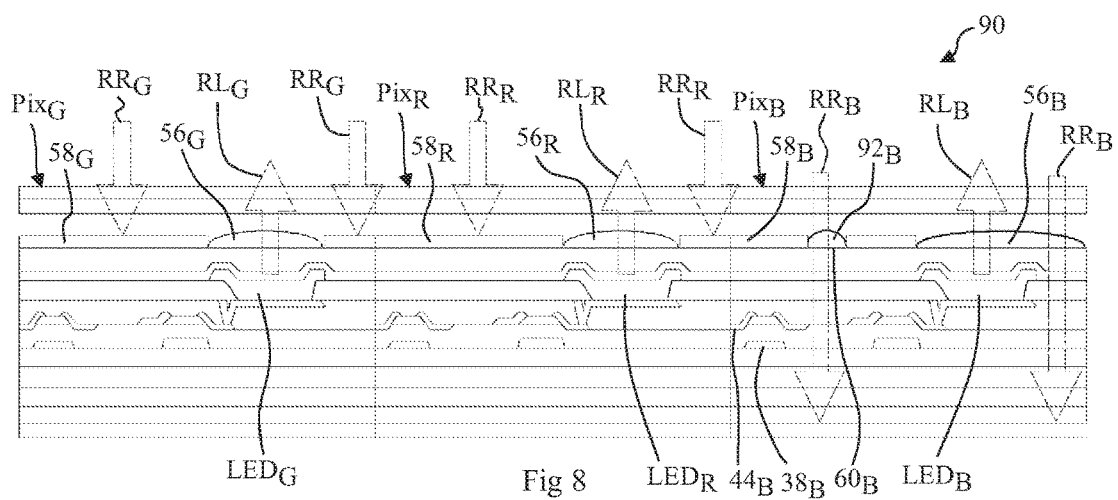

FIG. 8 is a cross-section view of another embodiment of a display and detection system 90. The display sub-pixels $Pix_G$ and $Pix_R$ of display and detection system 90 are identical to the display sub-pixels $Pix_G$ and $Pix_R$ of display and detection system 85. The display sub-pixel $Pix_B$ of display and detection system 90 comprises all the elements of the display sub-pixel Pix of display and detection system 30 shown in FIG. 3 and further comprises at least one additional colored filter $92_B$ on the region $60_B$ which is not covered with absorbing elements $58_B$. Preferably, the additional colored filter $92_B$ has the same composition as colored filter $56_B$. The display screen 12 of display and detection system 90 has an increased contrast with respect to the display and detection system 85 shown in FIG. 7 since reflections on conductive tracks 38B and 44B are suppressed.

Figure 9:
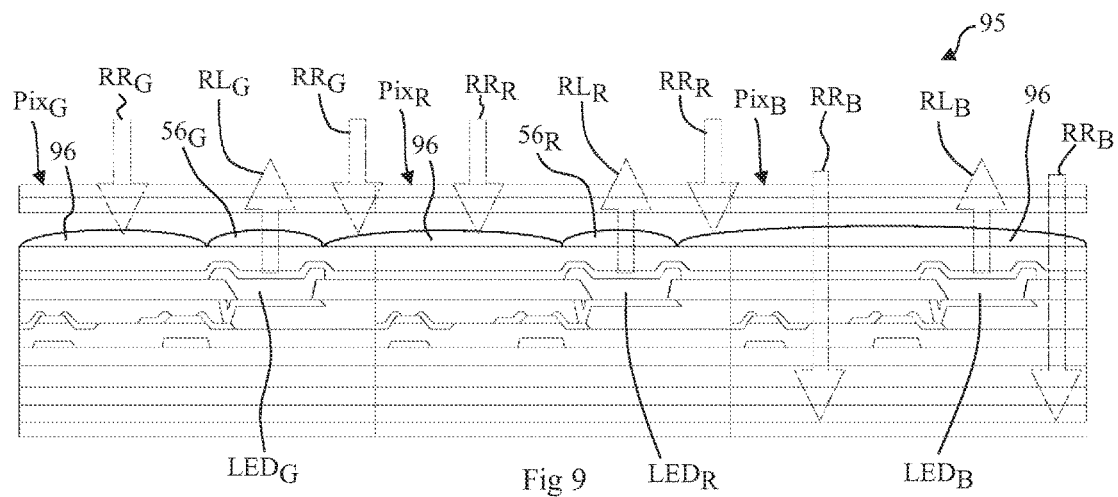

FIG. 9 is a cross-section view of another embodiment of a display and detection system 95. Display and detection system 95 comprises all the elements of display and detection system 85, with the difference that absorbing elements $58_G$, $58_R$ and $58_B$ and colored filter $56_B$ are replaced with a colored filter 96 having the same filtering properties as colored filter $56_B$. For display sub-pixels $Pix_G$ and $Pix_R$, the reflected radiation $RR_G$ and $RR_B$ is blocked by colored filter 96 while for display sub-pixel $Pix_B$, the reflected radiation $RR_B$ propagates through colored filter 96. As a variation, display and detection system 95 further comprises absorbing elements, similar to absorbing elements $58_G$, $58_R$, and $58_B$, opposite the metal tracks along the stacking direction of display screen 12 which may be located at any level between transparent layer 24 and conductive tracks 38, 44. This enables to still further improve the antireflection effect.

Figure 10:
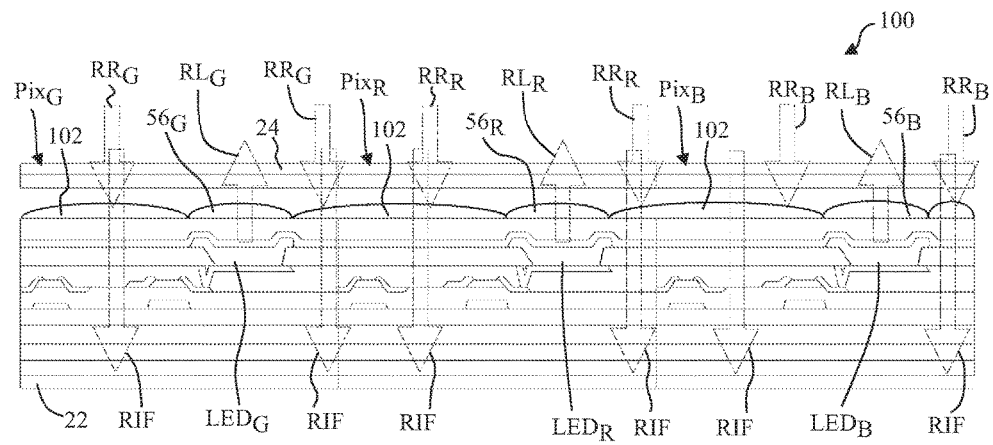

FIG. 10 is a cross-section view of another embodiment of display and detection system 100. Display and detection system 100 comprises all the elements of display and detection system 85, with the difference that absorbing elements $58_G$, $58_R$, and $58_B$ are replaced with a colored filter 102 capable of letting through a radiation RIF in a wavelength range different from the wavelength ranges of the radiations emitted by light-emitting diodes $LED_G$, $LED_R$, and $LED_B$, for example, in infrared or near infrared. As a variation, display and detection system 100 further comprises absorbing elements similar to absorbing elements $58_G$, $58_R$, and $58_B$, opposite the metal tracks along the stacking direction of display screen 12 which may be located at any level between transparent layer 24 and conductive tracks 38, 44. This enables to still further improve the antireflection effect.

In the present embodiment, display and detection system 100 may comprise a light source, not shown, capable of emitting a light radiation in layer 24, which then plays the role of a waveguide. The radiation emitted by the source may be a visible radiation and/or an infrared radiation and is in a wavelength range detected by image sensor 22. The radiation is injected into layer 24 from the periphery of layer 24, for example, from a lateral edge of layer 24. This radiation may be partially reflected when an object, for example, a finger, is laid on layer 24, the reflected radiation being detected by image sensor 22.

Figure 11:
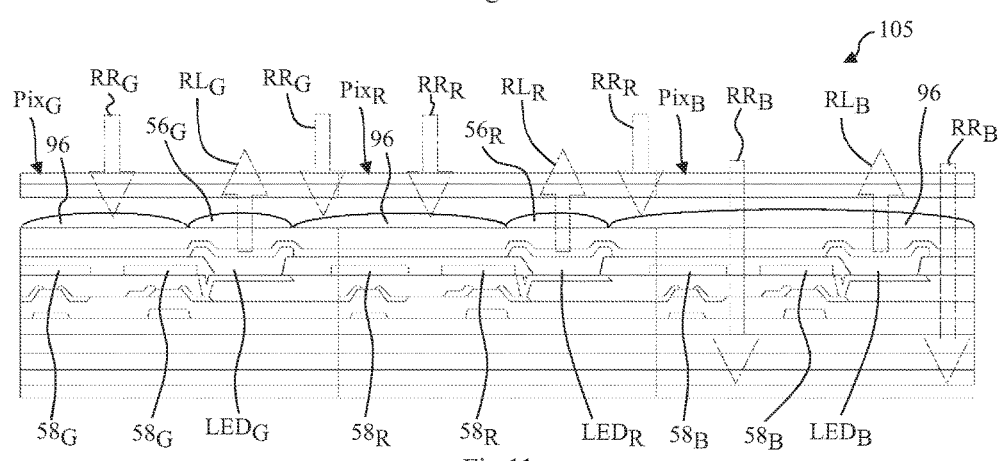

FIG. 11 is a cross-section view of another embodiment of a display and detection system 105. Display and detection system 105 comprises all the elements of display and detection system 95, each display sub-pixel $Pix_G$, $Pix_R$, and $Pix_B$ further comprising absorbing elements 58G, 58$_R$, and 58$_B$ of the embodiment of display sub-pixel Pix shown in FIG. 4.

Specific embodiments have been described. Various alterations and modifications will occur to those skilled in the art. Further, the display and detection system may further comprise an angular filter arranged between display screen 12 and image sensor 22. The angular filter is capable of filtering the incident radiation according to the incidence of the radiation relative to the upper surface of the angular filter, particularly so that image sensor 22 only receives rays having an incidence relative to an axis perpendicular to the upper surface of the angular filter smaller than a maximum angle of incidence smaller than 45°, preferably smaller than 30°, more preferably smaller than 20°, more preferably still smaller than 10°. The angular filter is capable of blocking the rays of the incident radiation having an incidence relative to an axis perpendicular to the upper surface of the angular filter greater than the maximum angle of incidence. The angular filter may comprise an array of holes delimited by walls opaque to said radiation. According to another embodiment, absorbing elements 58 may play the role of an angular filter. In this case, passageways 60, 60B form the holes of the angular filter. Height h of the holes, measured along the stacking direction of display screen 12, may vary from 1 µm to 1 mm, preferably from 20 µm to 100 µm. Width w of the holes, measured along the stacking direction of display screen 12, may vary from 5 µm to 30 µm, and may for example be 10 µm. Ratio h/w may vary from 1 to 10. Pitch p may vary from 10 µm to 30 µm, and may for example be 15 µm.

It should be noted that those skilled in the art may combine these various embodiments and variations without showing any inventive step. In particular, the absorbing elements 58 described in relation with FIGS. 5 and 6 may be implemented with display and detection systems 85, 95, 100, or 105 respectively shown in FIGS. 7, 9, 10, and 11.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A display and detection system comprising a display screen comprising a stack of layers along a stacking direction and comprising first and second display sub-pixels, each first display sub-pixel comprising a first light-emitting component capable of emitting a first radiation and covered with a first colored filter and first electrically-conductive tracks, each second display sub-pixel comprising a second light-emitting component capable of emitting a second radiation and covered with a second colored filter and second electrically-conductive tracks, the first colored filter being capable of letting through the first radiation and of blocking the second radiation, the second colored filter being capable of letting through the second radiation and of blocking the first radiation, the display and detection system further comprising an image sensor covered with the display screen and capable of detecting the first radiation, the second radiation, or a third radiation,
   wherein at least the first display sub-pixels comprise first elements absorbing the first radiation and the second radiation and covering the first electrically-conductive tracks,
   wherein, for each first display sub-pixel, the first absorbing elements, the first colored filter, and/or the first electrically-conductive tracks delimit at least one first passageway along the stacking direction for the first radiation, the second radiation, or the third radiation, and
   wherein the first absorbing elements are in contact with the first electrically-conductive tracks.

2. The display and detection system of claim 1, wherein, for each first display sub-pixel, the entire surface of the first display sub-pixel is covered with the first absorbing elements and the first colored filter.

3. The display and detection system of claim 1, comprising at least one dielectric layer interposed between the first absorbing elements and the first electrically-conductive tracks.

4. The display and detection system of claim 1, wherein the image sensor is capable of detecting the second radiation and wherein the first absorbing elements comprise third colored filters capable of letting through the second radiation and of blocking the first radiation.

5. A display and detection system comprising a display screen comprising a stack of layers along a stacking direction and comprising first and second display sub-pixels, each first display sub-pixel comprising a first light-emitting component capable of emitting a first radiation and covered with a first colored filter and first electrically-conductive tracks, each second display sub-pixel comprising a second light-emitting component capable of emitting a second radiation and covered with a second colored filter and second electrically-conductive tracks, the first colored filter being capable of letting through the first radiation and of blocking the second radiation, the second colored filter being capable of letting through the second radiation and of blocking the first radiation, the display and detection system further comprising an image sensor covered with the display screen and capable of detecting the first radiation, the second radiation, or a third radiation,
   wherein:
      the first electrically-conductive tracks are made of a material absorbing the first radiation and the second radiation; or
      the first electrically-conductive tracks are transparent for the first radiation and the second radiation; or
      at least the first display sub-pixels comprise first elements absorbing the first radiation and the second radiation and covering the first electrically-conductive tracks,
   wherein, for each first display sub-pixel, the first absorbing elements, the first colored filter, and/or the first electrically-conductive tracks delimit at least one first passageway along the stacking direction for the first radiation, the second radiation, or the third radiation, wherein the image sensor is capable of detecting the third radiation and wherein the first absorbing elements comprise third colored filters capable of letting through the third radiation and of blocking the first and second radiations, and wherein the first elements absorb the third radiation.

6. A display and detection system comprising a display screen comprising a stack of layers along a stacking direction and comprising first and second display sub-pixels, each first display sub-pixel comprising a first light-emitting component capable of emitting a first radiation and covered with a first colored filter and first electrically-conductive tracks, each second display sub-pixel comprising a second light-emitting component capable of emitting a second radiation and covered with a second colored filter and second electrically-conductive tracks, the first colored filter being capable of letting through the first radiation and of blocking the second radiation, the second colored filter being capable of letting through the second radiation and of blocking the first radiation, the display and detection system further comprising an image sensor covered with the display screen and capable of detecting the first radiation, the second radiation, or a third radiation, wherein:
the first electrically-conductive tracks are made of a material absorbing the first radiation and the second radiation; or
the first electrically-conductive tracks are transparent for the first radiation and the second radiation; or
at least the first display sub-pixels comprise first elements absorbing the first radiation and the second radiation and covering the first electrically-conductive tracks, wherein, for each first display sub-pixel, the first absorbing elements, the first colored filter, and/or the first electrically-conductive tracks delimit at least one first passageway along the stacking direction for the first radiation, the second radiation, or the third radiation, and wherein the second display sub-pixels comprise second elements absorbing the first radiation and the second radiation and covering the second electrically-conductive tracks.

7. The display and detection system of claim 6, wherein the second absorbing elements and/or the second colored filter delimit at least one second passageway for the second radiation.

8. The display and detection system of claim 7, wherein the second passageway is covered with a third colored filter capable of letting through the second radiation.

9. A display and detection system comprising a display screen comprising a stack of layers along a stacking direction and comprising first and second display sub-pixels, each first display sub-pixel comprising a first light-emitting component capable of emitting a first radiation and covered with a first colored filter and first electrically-conductive tracks, each second display sub-pixel comprising a second light-emitting component capable of emitting a second radiation and covered with a second colored filter and second electrically-conductive tracks, the first colored filter being capable of letting through the first radiation and of blocking the second radiation, the second colored filter being capable of letting through the second radiation and of blocking the first radiation, the display and detection system further comprising an image sensor covered with the display screen and capable of detecting the first radiation, the second radiation, or a third radiation, and an angular filter capable of blocking incident rays having an incidence relative to a direction orthogonal to a surface of the angular filter greater than a threshold and of letting through at least certain incident rays having an incidence relative to a direction orthogonal to the surface smaller than the threshold, wherein:
the first electrically-conductive tracks are made of a material absorbing the first radiation and the second radiation; or
the first electrically-conductive tracks are transparent for the first radiation and the second radiation; or
at least the first display sub-pixels comprise first elements absorbing the first radiation and the second radiation and covering the first electrically-conductive tracks, wherein, for each first display sub-pixel, the first absorbing elements, the first colored filter, and/or the first electrically-conductive tracks delimit at least one first passageway along the stacking direction for the first radiation, the second radiation, or the third radiation, and wherein the first absorbing elements form the angular filter.

* * * * *